United States Patent [19]

Schmidt

[11] Patent Number: 4,996,391
[45] Date of Patent: Feb. 26, 1991

[54] PRINTED CIRCUIT BOARD HAVING AN INJECTION MOLDED SUBSTRATE

[75] Inventor: Hans Schmidt, Eurasburg, Fed. Rep. of Germany

[73] Assignee: Siemens Aktiengesellschaft, Berlin and Munich, Fed. Rep. of Germany

[21] Appl. No.: 388,818

[22] Filed: Aug. 3, 1989

[30] Foreign Application Priority Data

Sep. 30, 1988 [DE] Fed. Rep. of Germany ....... 3833353

[51] Int. Cl.⁵ .......................... H05K 1/00; H05K 3/10
[52] U.S. Cl. ...................................... 174/255; 29/849; 29/852; 174/261; 174/266
[58] Field of Search .................. 174/68.5, 250, 255, 174/261, 266; 29/848, 849, 852; 361/419

[56] References Cited

U.S. PATENT DOCUMENTS

| | | | |
|---|---|---|---|
| 4,363,930 | 12/1982 | Hoffman | 174/255 |
| 4,374,457 | 2/1983 | Wiech, Jr. | 29/848 X |
| 4,402,135 | 9/1983 | Schweingruber et al. | 174/250 X |
| 4,510,347 | 4/1985 | Wiech, Jr. | 174/255 |
| 4,532,152 | 7/1985 | Elarde | 29/848 X |
| 4,604,799 | 8/1986 | Gurol | 427/97 X |

FOREIGN PATENT DOCUMENTS 1075825 3/1977 Canada .
2715875 4/1976 Fed. Rep. of Germany .

Primary Examiner—Morris H. Nimmo
Attorney, Agent, or Firm—Hill, Van Santen, Steadman & Simpson

[57] ABSTRACT

A printed circuit board includes an injected molded substrate having a pattern recessed in the substance surface of interconnect traces, through-connections and connecting rods. A trench-shaped depression is provided in the substrate surface in the region of each interconnect trace, and a planar depression is provided in the substrate's surface in at least one of (a) the region of each through-connection and (b) the region of each contact surfacae. The pattern of recesses is covered with a conductive metal coat, and the depth of each planar depression is greater than the depth of each trench-shaped depression, so that the metal coat fills the trench-shaped depressions to the surface of the substrate, while in the planar depressions a distance remains between the metal coat and the surface of the substrate. A solder stop lacquer can then be applied such as by roller coating, without the necessity of photo-structuring and without filling the planar depressions.

15 Claims, 2 Drawing Sheets

PRINTED CIRCUIT BOARD HAVING AN INJECTION MOLDED SUBSTRATE

BACKGROUND OF THE INVENTION

The subject matter of the present application is related to U.S. Ser. No. 406,551, filed Sept. 13, 1989 entitled "Printed Circuit Board Having An Injection Molded Substrate" naming Marcel Heermann as the inventor, and assigned to the same assignee as the present application.

The present invention relates to a printed circuit board having an injection molded substrate, with a surface comprised of trench-shaped depressions in the region of interconnect and traces of planar depressions in the region of through-connections and/or the region of connecting pads The recessed regions contain a conductive metal coat.

As will be understood by those skilled in the art, the term interconnect pattern refers to all of the electrically conductive structures which are utilized on a PC board. The term "interconnect trace" refers to the conductive path which extends between any two connection points on the board. The term "throughconnections", as used herein, refers to two types of printed circuit board structures. The first structure relates to the metalized holes which connect the conductor paths of one wiring level of the PC board to another wiring level. The second structure referred to as a "through connection" is the metalized hole which is used to accept a component, such as a resistor lead or an integrated circuit pin, therein. Finally, the term "connecting pad" refers to the planar areas of the circuit pattern which serve, for example, for the connection of components or connecting wires.

These terms have been defined for clarification purposes only. However, the definitions set forth are not meant to be all inclusive. Accordingly, the terms should be accorded their full scope as they would be understood by those skilled in the art.

Printed circuit boards having an injection molded substrate or a similarly formed substrate are disclosed in DE-A-27 15 875 and the corresponding CA-A-107 58 25, and in U.S. Pat. No. 4,532,152.

In order to manufacture the printed circuit board disclosed, for example, in DE-A-27 15 875, the substrate is first developed into a form in which the conductive pattern and the through-connection holes are contained in the shape of depressions. After mechanical and/or chemical surface treatment, the substrate is then chemically activated. Once this has occurred, the raised surfaces of the substrate are covered by a protective layer. Only the depressions have to remain free during the application of this protective layer. Therefore, it is no longer necessary to have an involved photostructuring of the resist but rather the application can be done, for example, with a doctor or by roller coating. Next, the conductive metal coat is applied. The coat is preferably applied by currentless metal deposition. The metal coat leads to the formation of the entire conductor configuration in the depressions of the substrate and in the through-connections holes. Finally, a solder stop lacquer is applied on the conductor surfaces which are not numbered in any solder connections.

By structuring the substrate before the selective metallization, the corresponding resist does not need photostructuring. However, the application of the solder stop lacquer require either a selective application onto the interconnect traces or photostructuring. One of these two methods are required in conventional circuit boards and manufacturing methods, since the planar depressions, which surround the through-connections as solder eyes or which serve as connecting pads, must remain free of these solder stop lacquer.

SUMMARY OF THE INVENTION

The present invention provides a printed circuit board comprising an injection molded substrate wherein the application of the solder stop lacquer can be done simply and without photostructuring. The present invention accomplishes this objective by having the planar depressions deeper than the trench-shaped depressions and by having the metal coat in th trench-shaped depressions be at least as high as the surface of the substrate.

To this end, the present invention provides a printed circuit board in the form of an injection molded substrate with a substrate surface having a recessed conductive pattern formed by trench-shaped depressions in the region of the interconnects and by planar depressions in the regions of each through-connection and/or in the region of each contact surface. The recessed regions have a conductive metal coat, and the planar depressions are deeper in the substrate than the trench-shaped depressions with the metal coat in the trench-shaped depressions extending to the surface of said substrate.

In one embodiment, the planar depressions of the printed circuit board can be in either the regions of the through-connections or the regions of the connecting pads.

In another embodiment, the metal coat in the region of the planar depressions is coated with a tin layer by hot-tinning.

In an further embodiment, the metal coat is formed by chemically applied copper.

The trench-shaped depressions and the planar-shaped depressions are introduced to the circuit board's injection molded substrate surface. In an embodiment, the depth of the planar depressions is greater than the depth of the trench-shaped depressions by at least a factor of 1.5.

Additional features and advantages of the present invention are described in, and will become apparent from, the detailed description of the presently preferred embodiments.

DETAILED DESCRIPTION OF THE PREFERRED EMBODIMENTS

The present invention provides a printed circuit board having an injected molded substrate, with a surface recessed by trench-shaped depressions in the region of interconnect traces and by planar depressions in the region of through-connections and/or connecting pads. The recesses are provided, with a conductive metal coat in the recessed regions.

The present invention is based on the perception that metal depositions can lead to a filling of the trench-shaped depressions up to the substrate surface, while not fully filling the planar depressions where a substrate has planar depressions deeper than its trench-shaped depressions. The metal simultaneously deposited into the planar depressions does not reach the level of the surface of the substrate. The result is that the interconnect traces can be safely protected in a planar application of the solder stop lacquer with, for example, a doctor or by roller coating. In addition, the planar depressions that are to form the solder eyes or connecting pads remain free and can be, along with the walls of the through-connection holes, coated with a solder layer by hot-tinning.

In the present invention, the metal coat is preferably executed by chemically applying copper that is coated with a suitable solder layer, particularly tin, to the area of the solder eyes connecting of the through-connection pads, and the through-connection holes. The present invention also specifies a printed circuit board with an injection molded substrate that has planar depressions which are deeper than its trench-shaped depressions. Preferably, the depth of the planar depressions is greater than the depth of the trench-shaped depressions by a factor of at least 1.5. When such a dimension exists, it is reliably assured that the metal coat of the planar depressions will remain absolutely free of the solder stop lacquer after roller coating.

Figure 1:
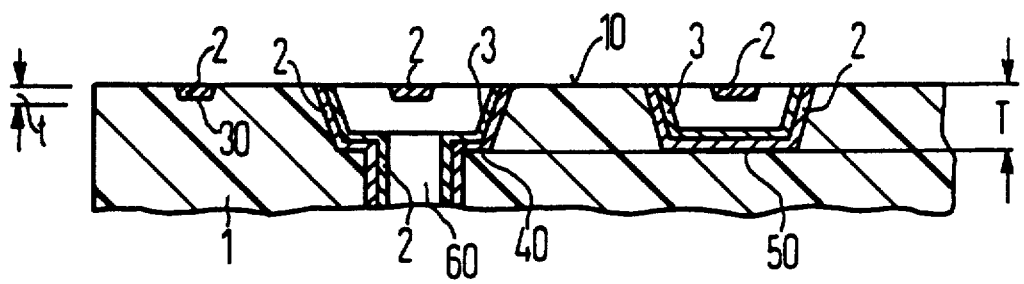
FIG. 1 is a cross-sectional view of part of a printed circuit board in the form of injected molded substrate having a geometry in accordance with the principles of the present invention.

FIG. 1 shows a cross-sectional view of a substrate 1 composed, for example of fiberglass-reinforced polyetherimide. Through the injection molding process, the trench-shaped depressions 30, the planar-shaped depressions 40, which lie in the region of the through-connection holes 60, and the planar-shaped depressions 50 are produced in the substrate 1. The trench-shaped depressions 30 have a depth of t, while the planar-shaped depressions 40 and 50 have a depth of T. A metal coat 2, whose thickness is the same as the depth t, fills the trench-shaped depression 30 to the surface 10 of the substrate 1 and thereby forms an interconnect trace. The metal coat 2 in the planar depressions 40 and 50 only reaches the surface 10 at the top of the depression walls. The metal coat at the base of the planar depressions 40 and 50 remains a clear distance from the level of the surface 10. If, for example, T equals 2t, then a distance amounting to t remains, in the planar depressions 40 and 50, between the metal coat 2 and the surface 10. The distance between the metal coat 2 and the surface 10 for the planar depressions 40 and 50 always has to be large enough so that only the interconnect traces in the trench-shaped depressions 30 are covered when a planar coating of the surface 10 with a solder stop layer is done. The distance must also be large enough so that the solder eyes of the through-connections of the planar depressions 40 and the connecting pads in the region of the planar depression 50 are not covered. After the application of a solder stop lacquer, which is not shown in FIG. 1, the regions of the metal layer 2 which serve as through-connections, solder eyes of the through-connection pads, and connections can be coated with a tin layer 3 by hot-tinning.

Figure 2:
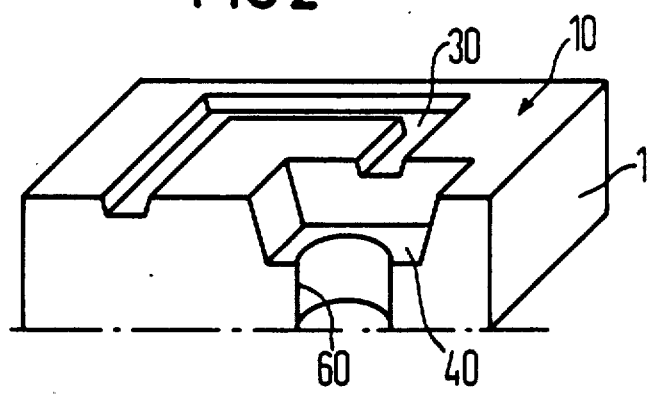
FIGS. 2-6 illustrate the method steps of the manufacture of the printed circuit board of the present invention, which is shown in FIG. 1.

FIG. 2 shows a part of the injection molded substrate 1 of a printed circuit board. The injection molded part contains the trench-shaped depressions 30, corresponding to the interconnect traces, and the planar depressions 40 and through-connection holes 60, which depart from the interconnect traces.

Figure 3:
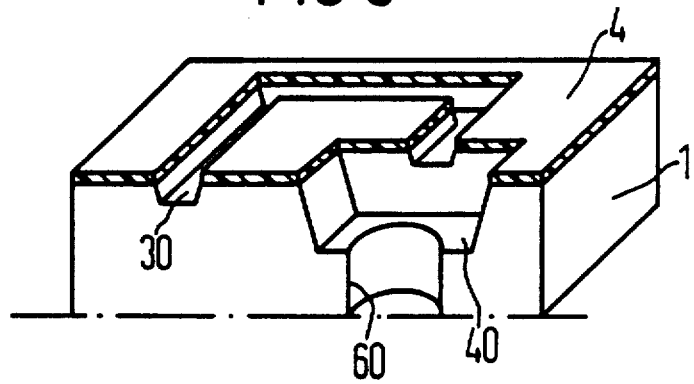

FIG. 3 shows a lacquer layer 4, which involves a standard plating resist, applied to the surface 10 of the substrate 1 in a standard surface treatment. The lacquer layer 4 is applied by a roller coating so that the depressions 30 and 40 remain free.

Figure 4:
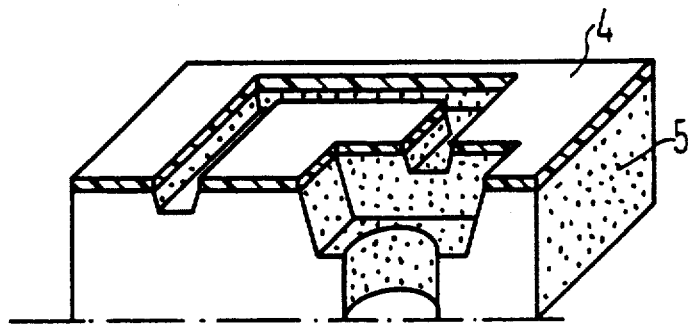

In FIG. 4, a nucleation 5 is applied. The dots in the drawing indicate the nucleation. The application of this nucleation occurs, for example, by immersion of the substrate 1 into a $PdCl_2$-$SnCl_2$ bath. Once applied, the nucleation 5 is activated, which involves a reducing or an accelerating that is standard in additive technology.

Figure 5:
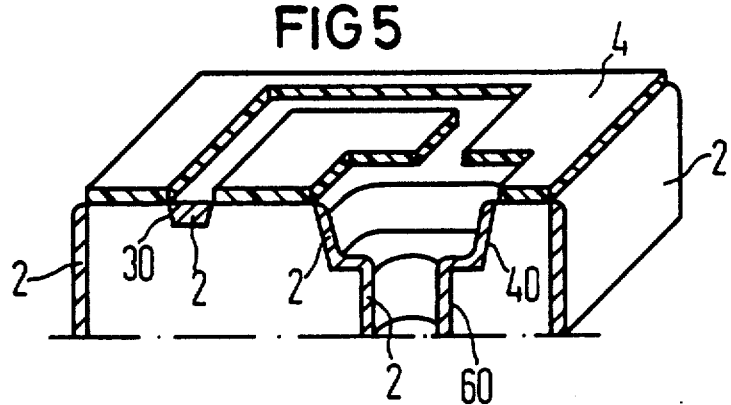

In FIG. 5, the metal layer 2 is applied onto the regions not protected by a lacquer layer 4. The metal layer is applied by chemical metal deposition, which is free of external currents. In FIG. 5, the metal lacquer layer 2, when applied in a commercially available currentless copper bath, has reached a thickness by a corresponding dimensioning of the coating duration that achieve a complete filling of the trench-shaped depression 30 to the substrate surface.

Figure 6:
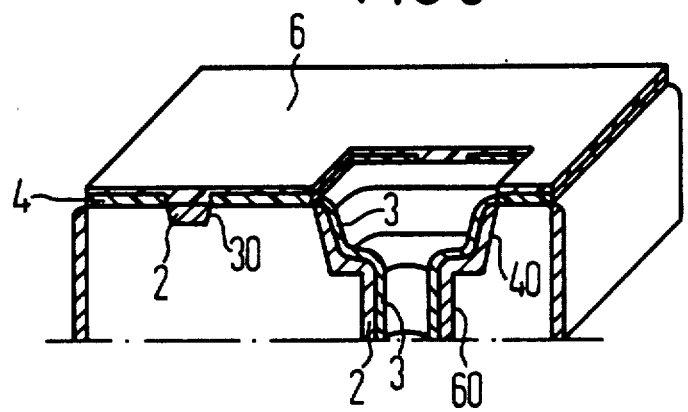

FIG. 6 shows a solder stop layer 6 which has been previously applied. Once the solder stop lacquer layer 6 has been applied, it leaves the planar depressions 40 and the through-connection holes 60 free which enables the tin layer 3 to be applied by hot-tinning. As shown in FIG. 6, the lacquer layer 4 does not have to be removed before the solder stop layer 6 can be applied.

The term "printed circuit board", as well as the simplified drawings, refer to and show a planar structure. The advantage of the injection molded substrates and the application of plating resist into the solder stop lacquer that are possible without photostructuring, can be done not only in the planar form, but also in three dimensional printed circuit boards which have arbitrarily, angled and curved shapes.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim as my invention:

1. A printed circuit board comprising:
    an injection molded substrate having a surface;
    a pattern of interconnect traces, through-connections and connecting pads recessed in said substrate surface formed by a trench-shaped depression in the region of each interconnect trace and by a planar depression in at least one of (a) the region of each through-connection and (b) the region of each connecting pad; and
    said planar and trench-shaped depressions having a conductive metal coat, the depth of each trench-shaped depression being dimensioned less than the depth of each planar depression, so that, as a result of the difference in depth between each trench-shaped depression and each planar depression, said metal coat fills each trench-shaped depression to the surface of the substrate, and in each planar depression a distance remains between the metal coat and the surface of the substrate.

2. A printed circuit board as claimed in claim 1 further comprising a tin layer applied by hot-tinning covering said metal coat.

3. A printed circuit board as claimed in claim 1 wherein said metal coat consists of copper chemically applied to said substrate.

4. A printed circuit board as claimed in claim 1 wherein the depth of said planar depressions is greater than the depth of said trench-shaped depressions by at least a factor 1.5.

5. A method for manufacturing a circuit board comprising:
   generating a pattern of recesses in a surface of a substrate by forming a trench-shaped depression in the region of an interconnect trace and by forming a planar depression in at least one of (a) the region of a through-connection or (b) the region of a connecting pad, with the depth of said trench-shaped depression being less than the depth of said planar depression; and
   applying a metal coat to said substrate so that, as a result of the difference in depth between said trench-shaped depression and said planar depression, said metal coat fills said trench-shaped depression to said surface of said substrate and in said planar depression a distance remains between the metal coat and said surface of said substrate.

6. A method as claimed in claim 5 comprising the additional step of:
   covering said metal coat with a tin layer by hot-tinning.

7. A method as claimed in claim 5 wherein the step of applying said metal coat is further defined by chemically applying a copper coat to said substrate.

8. A method as claimed in claim 5 wherein the step of generating a pattern is further defined by generating a pattern of recesses in a surface of a substrate by forming a trench-shaped depression in the region of an interconnect trace and by forming a planar depression in at least one of (a) the region of a through-connection or (b) the region of a connecting pad, with the depth of said planar depression being greater than the depth of said trench-shaped depression by a factor of 1.5.

9. A printed circuit board comprising:
   an injection molded substrate having a surface, the surface having a planar depression and a trench-shaped depression disposed therein, the trench-shaped depression having a metal coat to form an interconnect trace, the planar depression having a metal coat to form one of (a) a through-connection or (b) a connecting pad;
   the trench-shaped depression and the planar depression each having a depth, the depth of the planar depression being greater than the depth of the trench-shaped depression so that when the metal coat is applied to the printed circuit board the metal coat fills the trench-shaped depression to the surface of the substrate while a distance remains between the metal coat and the surface of the substrate at the planar depression.

10. A printed circuit board as claimed in claim 9, further comprising a tin layer applied by hot-tinning covering the metal coat.

11. A printed circuit board as claimed in claim 9, wherein the metal coat comprises copper chemically applied to the substrate.

12. A printed circuit board as claimed in claim 9, wherein the planar depression is deeper than the trench-shaped depression by a factor greater than 1.5.

13. A method for manufacturing a circuit board from a substrate having a surface, the method comprising the steps of:
   forming a trench-shaped depression in the surface of the substrate in the region of an interconnect trace that is to be placed on the circuit board;
   forming a planar depression in the surface of the substrate in at least one of (a) the region of a through-connection that is to be disposed through the circuit board or (b) the region of a connecting pad that is to be placed on the circuit board, the planar depression having a greater depth in comparison to the trench-shaped depression; and
   applying a metal coat to the substrate so that, as a result of the difference in depth between the planar depression and the trench shaped depression, the metal coat fills the trench-shaped depression to the surface of the substrate and in the planar depression a distance remains between the metal coat and the surface of the substrate.

14. A method as claimed in claim 13, further comprising the step of covering the metal coat with a tin layer by hot-tinning.

15. A method as claimed in claim 13, wherein the step of applying the metal coat is further defined by chemically applying a copper coat to the substrate to form the circuit board.

* * * * *